United States Patent

Tsuda

(10) Patent No.: US 8,471,441 B2
(45) Date of Patent: Jun. 25, 2013

(54) PIEZOELECTRIC COMPONENT AND MANUFACTURING METHOD THEREOF

(75) Inventor: Toshimasa Tsuda, Saitama (JP)

(73) Assignee: Nihon Dempa Kogyo Co., Ltd., Shibuya-Ku, Tokyo (JP)

( * ) Notice: Subject to any disclaimer, the term of this patent is extended or adjusted under 35 U.S.C. 154(b) by 253 days.

(21) Appl. No.: 12/806,475

(22) Filed: Aug. 13, 2010

(65) Prior Publication Data

US 2011/0043078 A1  Feb. 24, 2011

(30) Foreign Application Priority Data

Aug. 19, 2009 (JP) ................. 2009-190010
Dec. 17, 2009 (JP) ................. 2009-285880
Jul. 7, 2010 (JP) ................. 2010-154423

(51) Int. Cl.
*H03H 9/25* (2006.01)
*H01L 41/08* (2006.01)

(52) U.S. Cl.
USPC .................... 310/348; 310/313 R; 310/313 B

(58) Field of Classification Search
USPC ............ 310/348, 349, 344, 364–365, 313 B, 310/340, 313 R; 29/25.35; 333/193
IPC .............................................. H03H 9/25,41/08
See application file for complete search history.

(56) References Cited

U.S. PATENT DOCUMENTS 7,034,434 B2 * 4/2006 Yamamoto et al. ....... 310/313 R
7,154,206 B2 * 12/2006 Shimada et al. .......... 310/313 R
2003/0000067 A1 * 1/2003 Hori ............................ 29/592.1

FOREIGN PATENT DOCUMENTS

JP  2006-108993  4/2006
JP  2006-197554  7/2006
JP  2007-142770  6/2007

* cited by examiner

*Primary Examiner* — Thomas Dougherty
*Assistant Examiner* — Karen B Addison
(74) *Attorney, Agent, or Firm* — Edwards Wildman Palmer LLP; Scott D. Wofsy; Christopher J. Capelli

(57) ABSTRACT

A piezoelectric component including a piezoelectric device having wiring electrodes disposed adjacent to a comb electrode and an insulation layer formed on an upper surface of a piezoelectric section. A rewiring layer is formed on an upper surface of the insulation layer and a protective film layer covers the entire upper surface of the rewiring layer excluding the comb electrode. An outer periphery wall section is formed by laminating a photosensitive resin film onto the protective film layer and a ceiling section is formed by laminating the photosensitive resin film onto top openings of the outer periphery wall section. Electrode posts are formed so as to pass through the outer periphery wall section and the ceiling section.

13 Claims, 3 Drawing Sheets

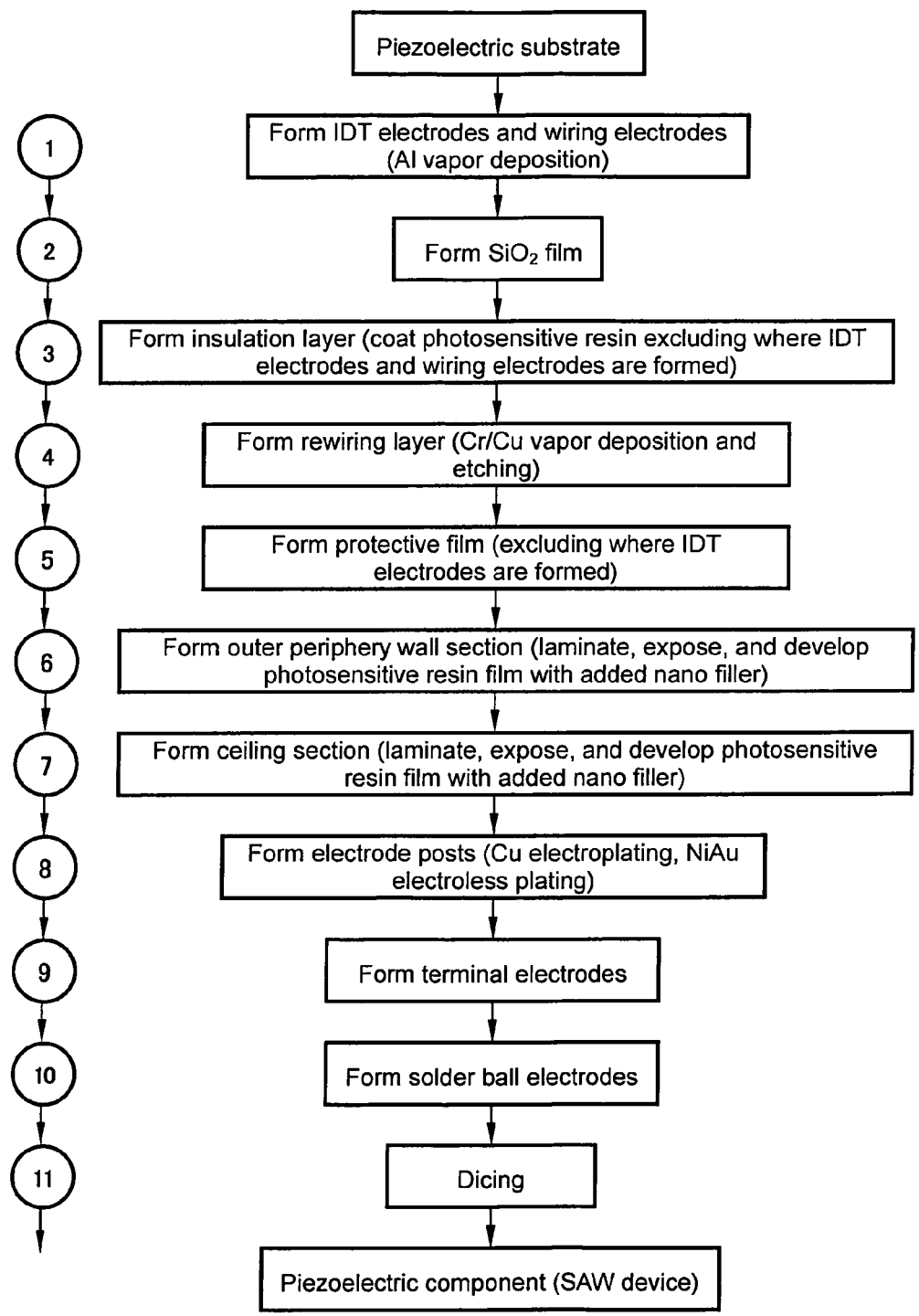

PIEZOELECTRIC COMPONENT AND MANUFACTURING METHOD THEREOF

TECHNICAL FIELD

The present invention relates to a piezoelectric component, such as a surface acoustic wave (SAW) device and a piezoelectric thin film filter used in a SAW duplexer and SAW filter, to be used in mobile communication devices such as a mobile phone. In particular, the invention relates to a piezoelectric component and a manufacturing method thereof, in which a piezoelectric device is packaged in chip size at wafer-level, and a photosensitive resin film to which is added a nano filler or a mica filler is used for an outer periphery wall section and ceiling section that constitutes a hollow section, to improve molding pressure resistance of the hollow section.

BACKGROUND ART

In a piezoelectric component (SAW device) equipped on a mobile phone, it is necessary to ensure a space, within which electrodes are oscillated due to a piezoelectric effect, and a predetermined hollow section around their comb electrode sections (IDT electrodes) is essential.

Conventionally, in order reduce the size of a SAW device, a SAW device chip is flip-chip bonded (face-down bonded) on a wiring substrate with use of a gold (Au) bump or solder bump, and the entirety of the SAW device chip is sealed with a resin or the like, to thereby configure a small size package device of a SAW device.

Furthermore, there has been proposed a microminiaturized chip-size package SAW device in which, in order to reduce the size and height of a SAW device, a predetermined hollow section is formed around comb electrode sections, the entirety of an aggregate piezoelectric substrate (wafer) on the comb electrodes side is sealed with a resin while retaining this hollow section, and having formed external connection electrodes, it is divided, by means of dicing, into individual SAW devices.

For example, in the SAW device disclosed in Patent Document 1 (Japanese Unexamined Patent Publication No. 2006-108993), a clearance (hollow section) formation layer (outer periphery wall) composed of a photosensitive resin is formed on the upper surface of a SAW chip (piezoelectric substrate), on which comb electrodes are formed, and a sealing layer (ceiling section) is laminated and sealed on this clearance formation layer, to thereby form a clearance (hollow section) around the comb electrodes.

Moreover, in the SAW device disclosed in Patent Document 2 (Japanese Unexamined Patent Publication No. 2006-197554), a cover having through electrodes is joined and sealed via a metallic joint section so as to face the SAW chip (piezoelectric substrate) having comb electrodes formed thereon, and a hollow section is formed between the SAW chip and the cover to accommodate the comb electrodes.

Moreover, in the SAW device disclosed in Patent Document 3 (Japanese Unexamined Patent Publication No. 2007-142770), a SAW element is provided on the surface of a piezoelectric substrate, a first resin section having a hollow section is provided on this SAW element, and a second resin section is provided on this first resin section, and a silica filler is added to this second resin section, to improve the elastic modulus of the second resin section (ceiling section).

SUMMARY OF THE INVENTION

Problems that the Invention is to Solve

However, when mounting this type of a piezoelectric component on a mount substrate and modularizing it on site by means of transfer molding, normally, a pressure ranging from 5 MPa to 15 MPa is applied. Consequently, in a case where the clearance (hollow section) formation layer and the sealing layer of the SAW device disclosed in Patent Document 1 (Japanese Unexamined Patent Publication No. 2006-108993) are configured only with organic materials, there is a possibility that the hollow section that accommodates the comb electrodes therein may be collapsed and the electrical characteristic of the comb electrodes may consequently be deteriorated in some cases when resin-sealing by means of transfer molding or the like, unless the thickness of the sealing resin layer that constitutes the ceiling section is increased or is configured with a hard material. However, it is extremely difficult to increase the thickness of the sealing resin layer, and configure the sealing resin layer with a hard material to thereby achieve desired molding pressure resistance, only with the photosensitive resin material used for this type of resin sealing.

Moreover, in the SAW device disclosed in Patent Document 2 (Japanese Unexamined Patent Publication No. 2006-197554), separate electrodes are required for forming through holes, in which through electrodes are to be provided, in a cover, and for joining and laminating a SAW chip (piezoelectric substrate) and the cover (substrate). Also there is a possibility that the substrates may be "warped" when laminating the substrates in some cases. Moreover there is a possibility that the cost of manufacturing piezoelectric components may increase in some cases as a result of laminating substrates (wafers) composed of the same material (piezoelectric substrate). Furthermore, in order to achieve reduction in the height of a piezoelectric component, the substrate (wafer) needs to be made thin. However, this has been extremely difficult to achieve.

Moreover, in the SAW device disclosed in Patent Document 3 (Japanese Unexamined Patent Publication No. 2007-142770), although the elastic modulus is improved by adding a silica filler to the photosensitive resin that constitutes the second resin section (ceiling section), the particle size of the added silica filler is large ranging from 0.01 to 8 µm. Therefore a sufficient mold pressure resistance effect can not be obtained.

Means for Solving the Problems

In order to solve the above problems, in the present invention, a nano filler is added to the photosensitive resin used in the outer periphery wall section that constitutes the hollow section in which the comb electrodes are sealed, and further, a nano filler or a mica filler is added to the photosensitive resin used in the ceiling section, to form photosensitive resin films which improve the elastic modulus of the outer periphery wall section and the ceiling section, and thereby manufacture, at a low cost, a piezoelectric component that has a superior level of molding pressure resistance while reducing the height and size thereof.

Consequently, a piezoelectric component of the present invention comprises: a piezoelectric substrate; a comb electrode formed on a main surface of the piezoelectric substrate; a piezoelectric device composed of wiring electrodes having device wiring sections disposed adjacent to the comb electrode; an insulation layer formed on an upper surface of the device wiring sections; a rewiring layer formed on an upper surface of the insulation layer; a protective film layer that is composed of an inorganic material and that covers the entire upper surface of the rewiring layer excluding the comb electrode; an outer periphery wall section formed by laminating a photosensitive resin film onto the protective film layer; a ceiling section formed by laminating the photosensitive resin film onto top openings of the outer periphery wall section; and electrode posts formed so as to pass through the outer periphery wall section and the ceiling section. Here the photosensitive resin film is composed of a photosensitive resin which contains an inorganic nano filler or mica filler with a mean particle size of 1.0 nm or less, and has an elastic modulus of 3.0 GPa or greater.

Moreover, a manufacturing method of a piezoelectric component of the present invention is a manufacturing method of a piezoelectric component' comprising: an aggregate piezoelectric substrate; a piezoelectric device formed on a main surface of the aggregate piezoelectric substrate; a wiring section formed on the aggregate piezoelectric substrate; a through electrode that is formed on the aggregate piezoelectric substrate and is connected to the wiring section; and a hollow section that is provided so as to surround an upper surface of the piezoelectric device. The method includes the steps of: laminating a photosensitive resin film on a main surface of the aggregate piezoelectric substrate to thereby form an outer periphery wall section that surrounds the piezoelectric device formed on the main surface of the aggregate piezoelectric substrate; and laminating a photosensitive resin film on an upper surface of the outer periphery wall section to thereby form a first ceiling section, wherein the photosensitive resin film is composed of a photosensitive resin that contains an inorganic nano filler and/or mica filler with a mean particle size of 1.0 nm or less, and has an elastic modulus of 3.0 GPa or greater.

Effects of the Invention

A piezoelectric component which has an excellent level of molding pressure resistance, and a reduced height and size, can be manufactured at a low cost without increasing the thickness of the component.

BRIEF DESCRIPTION OF THE DRAWINGS

FIG. 2 is a schematic process flow diagram of a manufacturing method of a SAW device according to an embodiment of a piezoelectric component of the present invention.

BEST MODE FOR CARRYING OUT THE INVENTION

Hereunder, a piezoelectric component and a manufacturing method thereof of the present invention are described in detail with reference to the appended FIGS. 1A, 1B and FIG. 2.

Embodiments

Piezoelectric Component (SAW Device)

Figure 1A:
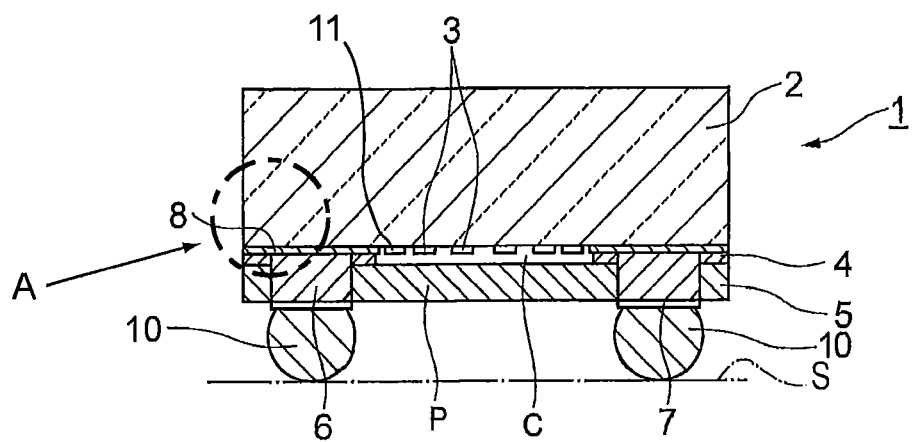
FIG. 1A is a view of a SAW device according to an embodiment of a piezoelectric component of the present invention.
Figure 1B:
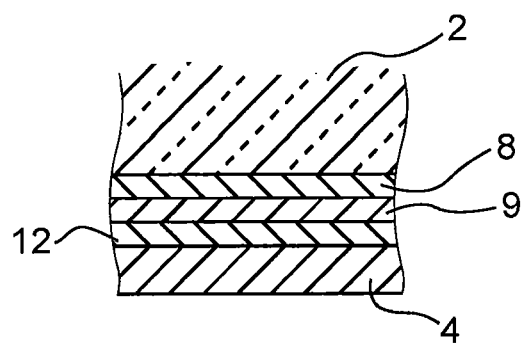
FIG. 1B is a partially enlarged drawing of section A in FIG. 1A.

FIG. 1A is a view of a SAW device, which is an embodiment of a piezoelectric component of the present invention.

This SAW device 1, as shown in FIG. 1A, comprises: a piezoelectric substrate (wafer) 2 composed of lithium tantalate ($LiTaO_3$), lithium niobate ($LiNbO_3$), or the like, or a piezoelectric substrate formed on a substrate and having a piezoelectric function; IDT electrodes 3 composed of aluminum film and formed on a main surface of the piezoelectric substrate 2 by sputtering or vapor deposition; an outer periphery wall section 4 which is composed of a photosensitive film laminated onto a principal surface of the piezoelectric substrate 2 and having an opening at a top thereof; and a ceiling section 5 similarly composed of a photosensitive film which is laminated on the upper surface of the outer periphery wall 4; wherein a hollow section C which surrounds the IDT electrodes 3 and the wiring electrodes, is formed between the laminated outer periphery wall section 4 and ceiling section 5 and the principal surface of the piezoelectric substrate 2.

Furthermore, of the piezoelectric substrate 2, for example at the four corners thereof, four electrode posts 6 are formed by electroplating inside holes (via holes) formed in a sealing resin P, the top ends of the electrode posts 6 are electrically connected to wiring electrodes formed on the main surface of the piezoelectric substrate 2, and the other ends thereof are electrically connected to terminal electrodes 7. Furthermore, if required, on the lower end section of these through electrodes 7 there are fixed solder ball electrodes 10, and flux is supplied therearound, thereby connecting the solder ball electrodes 10 respectively to external wiring electrodes 11 of a mount substrate S (printed substrate). Here, the reason for the solder ball electrodes 10 being fixed on the lower end section of the through electrodes 7 is that it is extremely difficult to perform an operation of connecting them to the mount substrate S if the pitch between the through electrodes 7 is as narrow as approximately 200 μm for example. Therefore, when performing an operation of mounting on a printed substrate on site for modularizing a semiconductor device, solder balls of a diameter of approximately 150 μm are preliminarily fixed on the lower end section of the through electrodes 7, to thereby configure the solder ball electrodes 10. In those cases where the through electrodes 7 can be directly connected on site to the mount substrate S using soldering paste, the solder ball electrodes 10 do not need to be fixed.

Here, the comb electrodes 3 and the wiring electrodes constitute the piezoelectric device. As the piezoelectric device, in addition to a surface acoustic wave (SAW) device, there may be applied a device manufactured by FBAR (film bulk acoustic resonator) and MEMS (micro-electro-mechanical system) technology.

Furthermore, the device wirings that constitute the wiring electrodes are configured with wirings that are composed of: a material containing any one of Al, Cu, Au, Cr, Ru, Ni, Mg, Ti, W, V, Ta, Mo, Ag, In, and Sn serving as the primary component thereof; a compound of these materials and oxygen, nitrogen, or silicon; an alloy of these materials; an intermetallic compound; or a multiple-layered lamination of these.

Moreover, on the principal surface of the piezoelectric substrate 2 where the IDT electrodes 3 and the wiring electrodes are formed, a SiO2 layer, an insulating layer 8 formed from photosensitive resin, and a rewiring layer 9 on an upper surface of this insulating layer 8, are sequentially formed. Furthermore, a protective film 12 layer is formed from a thin film of an inorganic material so as to cover the entire upper surface of the rewiring layer 9 excluding the IDT electrodes 3 (refer to FIG. 1B).

Here, when forming the insulating layer 8 formed on the main surface of the piezoelectric substrate 2, first, an insulating film composed of an organic material having a polyamide as its main component is formed, and on the surface (upper surface) of this insulating layer, a further insulating layer composed of an inorganic material and having a film thickness of 200 angstroms or greater may be formed.

Moreover, as the inorganic material which constitutes the protective film layer formed on the upper surface of the rewiring layer mentioned above, $SiO_2$, quartz glass, and carbon fiber and the like are suitable.

Figure 3:
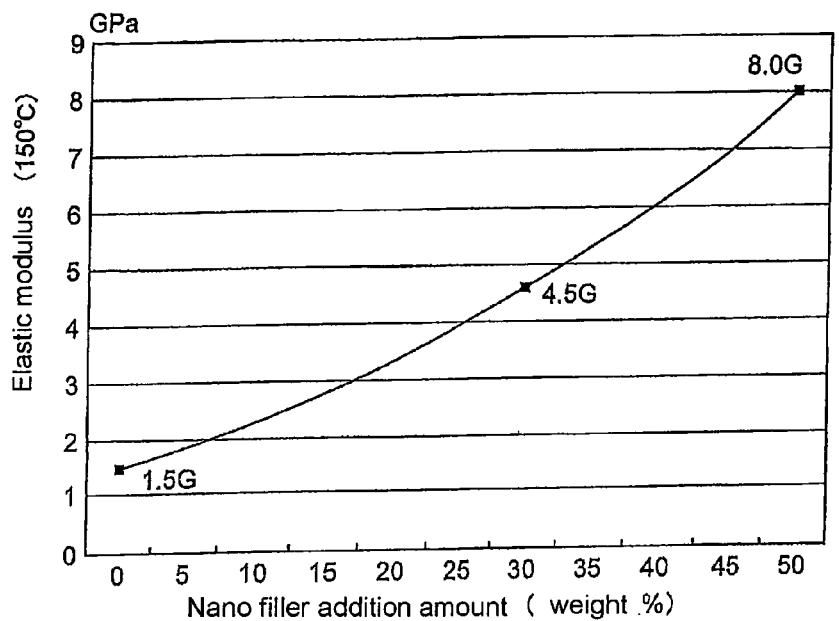
FIG. 3 is a graph showing a relationship between the amount of nano filler added to the photosensitive resin film (weight %) and the elastic modulus (150° C.).

In particular, in the SAW device of the embodiment of the piezoelectric component of the present invention, the outer periphery wall section 4 composed of a photosensitive resin film is formed on the upper surface of the protective film layer formed on the upper surface of the rewiring layer 9, and similarly the ceiling section 5 is formed by laminating a photosensitive resin film on the top end surface of the outer periphery wall section 4. As the photosensitive resin film which forms the outer periphery wall section 4 and the ceiling section 5, a photosensitive epoxy resin is used (refer to FIG. 3) to which an inorganic nano filler with a mean particle size of 1.0 nm (nanometers) or less is added, and which has an elastic modulus of 3.0 GPs (gigapascals) or greater (at temperatures of up to 180° C.).

Because this photosensitive resin film (for example epoxy resin film) to which a nano filler with a mean particle size of 1.0 nm or less is added, and which has an elastic modulus of 3.0 GPa is used in the outer periphery wall section 4 and the ceiling section, a piezoelectric component (SAW device) that has an excellent level of molding pressure resistance and that has a reduced height and size thereof can be manufactured at a low cost, without increasing the thickness of the component.

In particular, in the SAW device of the embodiment of the piezoelectric component of the present invention, as the photosensitive resin which forms the outer periphery wall section and the ceiling section, a photosensitive resin film (with a thickness of 50 to 100 μm, for example) to which a nano filler having a mean particle size of 1.0 nm or less is added is used in order to ensure a sufficient level of tolerance to high pressures (for example, from 5 MPa to 15 MPa) to be applied on the SAW device when performing transfer molding (resin sealing) on the mount substrate of the SAW device on site, and also to prevent the hollow section from being collapsed and the electrical characteristic of the comb electrodes from being consequently impaired.

Normally a nano filler has a mean particle size of 1 μm or less, particularly 1 nm to 500 nm, but as the nano filler of the present invention, a filler with a mean particle size of 1 nm or less, particularly 0.8 nm or less is used, and a photosensitive resin film with 0.0% to 30% by weight of a nano filler added is used.

In general, when the size (particle diameter) of the added filler is large (for example a silica filler with a mean particle size of 4 μm), if the filler filling factor is low, the effect of enhancing the elastic modulus is also low. Therefore, unless the amount of filler added to the photosensitive resin is at least 30%, the anticipated effect of improving the elastic modulus is not obtained. Thus, problems occur in that the cost of the photosensitive resin film increases, viscosity increases, and the desired reflow effect cannot be obtained during resin sealing.

In contrast, in the present invention, a photosensitive film having a nano filler with a mean particle size of 1 nm or less, particularly 0.8 nm or less, added at a ratio of approximately 1 to 30% by weight (a small quantity, for example 5%, will suffice) is molded into a film shape, and this photosensitive resin film is heat-pressed and bonded onto the piezoelectric substrate to form the outer periphery wall section. Furthermore, a photosensitive film with nano filler similarly added is heat-pressed and bonded (laminated) onto the top ends of this outer periphery wall section to form the ceiling section, to thereby form the hollow section with improved elastic modulus (hardness).

Furthermore, by adding this nano filler, not only can the thermal expansion coefficient of the photosensitive resin film be minimized, but the shrinkage factor during hardening can be minimized and the glass transition temperature increases from 150° C. to 195° C., allowing a predetermined elastic modulus (3 GPa) to be maintained within the temperature range of mold heating (150° C. to 180° C.).

Moreover, because the amount of nano filler added, as described above, is less than the amount of silica filler added, as the photosensitive resin material, deterioration in the shape of the outer periphery wall section and ceiling section after photolithography and development can be minimized.

Furthermore, normally, in the photosensitive resin material, by adding a standard filler to the resin material, it is possible to enhance the elastic modulus of the photosensitive resin material. However, when the photosensitive resin material is exposed to light, differences in the refractive index result in diffuse reflection. Therefore in conventional photolithography, forming the outer periphery wall section and ceiling section with the desired shape is extremely difficult. However, by using the nano filler, those shapes can be formed properly.

Here, as the particulate nano filler material added to the photosensitive resin material in the present invention, a material with translucent properties such as $SiO_2$, silica, or mica is best suited. In addition to the nano filler, a filler with a mean particle size of 15 μm or less can be added to the photosensitive resin material to enhance the elastic modulus.

Furthermore, in the present invention, a mica filler with a mean particle size of 15 μm or less is added to the photosensitive resin material that forms the ceiling section 5 in addition to the nano filler, or 10 to 45% by weight of the mica filler is added to the photosensitive resin material instead of the nano filler, so as to form a photosensitive resin film in which at the time of forming, the mica filler is highly oriented so as to be oriented in the same direction with respect to the surface of the photosensitive resin film. In particular, mica fillers have a high aspect ratio (ratio of short size to long size), for example 90, are thin, have a high level of strength, and can be obtained at a low price (less expensive than fillers composed of $SiO_2$ and the like).

Figure 4:
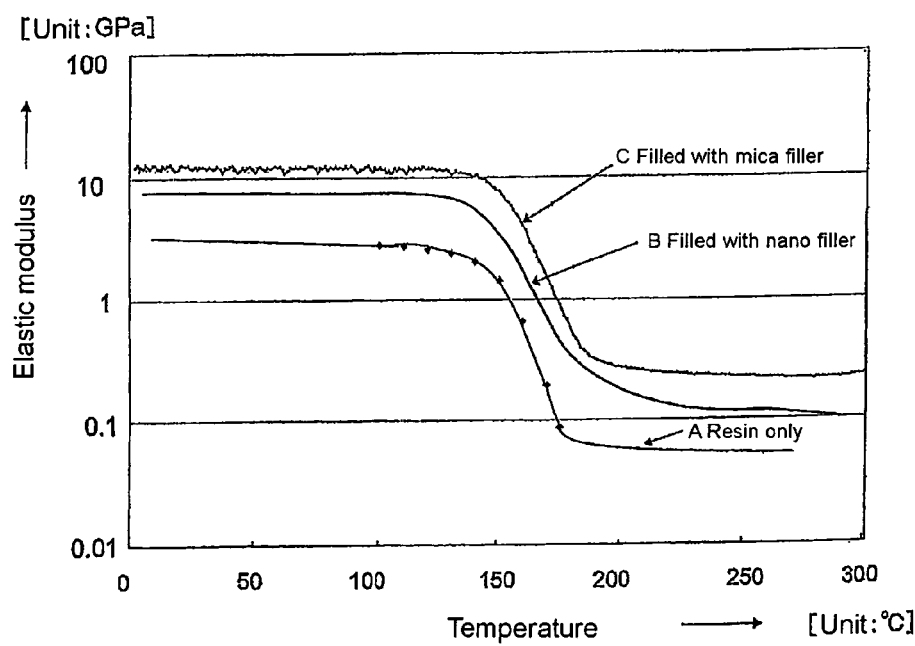
FIG. 4 is a graph showing elastic modulus in predetermined temperature ranges (across normal temperature, molding temperature, glass transition temperature, and reflowing temperature) in respective cases: where a photosensitive resin film consists only of resin (curve A); where the photosensitive resin film is filled with a nano filler (curve B); and where the photosensitive resin film is filled with a mica filler (curve C).

The present inventors have verified that by adding this mica filler to the photosensitive resin film, an elastic modulus of approximately 4.6 GPa can be improved to approximately 8.3 GPa making it highly elastic (refer to FIG. 4).

Moreover, by changing the curing agent of the photosensitive resin (raising the glass transition temperature), the elastic modulus of the photosensitive resin film itself can be increased from 2 GPa to 2.8 GPa making it highly elastic. Furthermore the glass transition temperature (Tg) thereof can be increased, for example, from 178° C. to 194° C., thereby improving the strength at the time of transfer molding.

Piezoelectric Component Manufacturing Method

Next, there is described, with reference to FIG. 2, a piezoelectric component manufacturing method of the present invention, with regard to a SAW device manufacturing method, which is an embodiment thereof.

First, as shown in FIG. 2, an aggregate piezoelectric substrate (wafer) composed of LiTaO$_3$, LiNbO$_3$, quartz, or the like is prepared. Then and in step (1), respectively corresponding comb electrodes (IDT) and wiring electrodes to be connected thereto are formed to a predetermined thickness (for example, 2,000 to 4,000 angstroms) on the main surface of the aggregate piezoelectric substrate (piezoelectric substrate that becomes individual (7,000 pieces for example) piezoelectric components (SAW devices) that form individual pieces after being cut), by sputtering or vapor depositing a metal film composed of Al and the like. Then unwanted metallic films and residual resist are removed by means of photolithography, to thereby form the comb electrode and wiring electrode (hereunder, referred to as "piezoelectric device").

Next, in step (2), on the surface of the piezoelectric devices, there is formed a protective film (SiO$_2$ film) composed of an inorganic material such as SiO$_2$ or an organic material. When forming the protective film (SiO$_2$ film) composed of SiO$_2$ on the upper surface of the piezoelectric device, first, an SiO$_2$ film is formed on the piezoelectric device. Then a resist composed of a photosensitive resin is coated on the entire piezoelectric substrate, and then the protective film (SiO$_2$ film) is formed by means of photolithography and dry etching with use of a CF$_4$ gas or the like.

Here, in the embodiment of the piezoelectric component manufacturing method of the present invention, a photosensitive resist is preliminarily coated on the upper surface of the piezoelectric device. Then a pattern is formed by means of photolithography, and then an inorganic material such as SiO$_2$ is sputtered, to thereby form the SiO$_2$ film on the surface of the piezoelectric device. Furthermore, it is possible to remove the resist by means of a lift-off process with use of a solvent, to thereby have the SiO$_2$ protective film only remaining in the required portion on the upper surface of the piezoelectric device.

Moreover, on the SiO$_2$ protective film excluding the IDT electrodes and the wiring electrodes, a photosensitive resin having a permittivity of not more than 3.5 (for example, a BCB resin (Cyclotene (registered trademark)) is coated to thereby form the insulating layer, and then by photolithography, the IDT electrodes and the wiring electrodes are exposed (step 3).

Next Cr serving as the adhesion layer and Cu serving as the conductor layer are vapor-deposited on the insulating layer formed on the SiO$_2$ film, a resist is applied, and then the IDT electrodes and wiring electrodes are exposed by photolithography, after which the Cr and Cu adhered to the resist are removed by a lift-off (etching) process, thereby forming the rewiring layer (step 4).

In step 5, on the upper surface of the rewiring layer formed earlier, a protective film layer composed of an inorganic material such as SiO$_2$ or an organic material with a thickness of 100 to 500 angstroms or thereabouts is formed so as to cover the IDT electrodes, and then having exposed the IDT electrodes by means of dry etching, a plating electrode is formed on the surface of the protective film layer on the piezoelectric substrate, with a material such as Cu/Al or TiW/Cu.

Next, the photosensitive resin film with the added nano filler is softened under heat and laminated onto the protective film layer, and then, by means of photolithography, patterning, exposure, and development are performed to form the outer periphery wall section having openings at the top thereof (step 6).

Furthermore, on the top openings of the outer periphery wall section formed earlier, in the same manner, a photosensitive resin film with a nano filler or mica filler added is softened under heat and laminated thereon, and then the ceiling section is formed by photolithography (step 7).

By these steps 6 and 7, as shown in FIG. 1A, a hollow section C enclosed by the outer periphery wall section 4 and the ceiling section 5 is formed in the resin-sealed section composed of the sealing resin P.

Furthermore, in step 8, in the outer periphery wall section and ceiling section formed from photosensitive resin film, the existing holes (via holes) are filled by performing Cu electroplating to form electrode posts. Then in step 9, Ni and Au electroless plating is performed on the terminal electrodes formed on the bottom ends of the electrode posts.

Here, the electrode posts are formed by Cu electroplating, and the terminal electrodes are formed by performing Ni and Au electroless plating on the bottom surfaces of the electrode posts. As a result, oxidation of the Cu-based electrode posts can be prevented, and the solderability of the electrode posts at the time of soldering on site is enhanced. Here, instead of Ni and Au plating, the plating of the terminal electrodes may be performed as electroless plating or electroplating with Au only, or with Ni, Pd, and Au.

Furthermore, the electrode posts, instead of electroplating, may be formed by embedding molten solder or embedding a conductive paste in the holes (via holes) for electrode formation.

Next, in step 10, solder balls of a diameter 150 μm or thereabouts are soldered on the lower end section of the through electrodes, thereby forming the solder ball electrodes 10.

Then, after electroplating is completed, the piezoelectric substrate is divided into individual piezoelectric components, to obtain separate piezoelectric components (SAW devices) (step (11)).

What is claimed is:

1. A piezoelectric component comprising: a piezoelectric substrate; a comb electrode formed on a main surface of the piezoelectric substrate; a piezoelectric device composed of wiring electrodes disposed adjacent to the comb electrode; an insulation layer formed on an upper surface of the piezoelectric sections; a rewiring layer formed on an upper surface of the insulation layer; a protective film layer that is composed of an inorganic material and that covers the entire upper surface of the rewiring layer excluding the comb electrode;
   an outer periphery wall section formed by laminating a photosensitive resin film onto the protective film layer; a ceiling section formed by laminating the photosensitive resin film onto top openings of the outer periphery wall section; and electrode posts formed so as to pass through the outer periphery wall section and the ceiling section, wherein;
   said photosensitive resin film is composed of a photosensitive resin to which is added an inorganic nano filler with a mean particle size of 1.0 nm or less, and has an elastic modulus of 3.0 GPa or greater.

2. A piezoelectric component according to claim 1, wherein a mica filler is added in addition to a nano filler, to said photosensitive resin film constituting said ceiling section.

3. A piezoelectric component according to claim 1, wherein said outer periphery wall section is formed by photolithography with a photosensitive resin having an elastic modulus of not more than 3 GPa, and said ceiling section is formed by a photosensitive resin film in which 10 to 45% by weight of a mica filler is added to a photosensitive resin.

4. A piezoelectric component according to claim 1, wherein said outer periphery wall section is formed by photolithography with a photosensitive resin having an elastic modulus of not more than 3 GPa, and said ceiling section is formed by a photosensitive resin film in which 10 to 45% by weight of a mica filler is added to a photosensitive resin, and which has an elastic modulus of 5 GPa or greater.

5. A piezoelectric component according to claim 1, wherein an addition amount of said nano filler is 0.3% to 30% (weight %).

6. A piezoelectric component according to claim 1, wherein said insulation film formed on an upper surface of said wiring section is an insulating film that includes an insulating film composed of an organic material formed on the upper surface of said wiring section, and an insulating film composed of an inorganic material with a thickness of 200 angstroms or greater formed on the upper surface of the insulating film.

7. A piezoelectric component according to claim 6, wherein said insulation film composed of an inorganic material is formed from a photosensitive material having a permittivity of not more than 3.5.

8. A piezoelectric component according to claim 1, wherein said device wiring section is configured with wiring that are composed of: a material containing any one of Al, Cu, Au, Cr, Ru, Ni, Mg, Ti, W, V, Ta, Mo, Ag, In, and Sn serving as a primary component thereof; a compound of these materials and oxygen, nitrogen, or silicon; an alloy of these materials; an intermetallic compound; or a multiple-layered lamination of these.

9. A piezoelectric component according to claim 1, wherein said piezoelectric substrate is formed such that a ceramic material or crystalline material is laminated on a piezoelectric substrate composed $LiTaO_3$, $LiNbO_3$, crystal, or on a substrate having a piezoelectric function that is formed on a substrate, or on these piezoelectric substrates.

10. A piezoelectric component according to claim 1, wherein on an outer surface of said ceiling layer and said outer periphery wall layer, there is formed a film that is composed of an insulating material made with an organic material of a photosensitive polyimide, or a quartz glass containing $SiO_2$, or that is composed of an insulating material such as a metal oxide film.

11. A piezoelectric component comprising: a piezoelectric substrate; a comb electrode formed on a main surface of the piezoelectric substrate; a piezoelectric device composed of wiring electrodes having device wiring sections disposed adjacent to the comb electrode; an insulation layer formed on an upper surface of the device wiring sections; a rewiring layer formed on an upper surface of the insulation layer; a protective film layer that is composed of an inorganic material and that covers the entire upper surface of the rewiring layer excluding the comb electrode;

an outer periphery wall section formed by laminating a photosensitive resin film onto the protective film layer; a ceiling section formed by laminating the photosensitive resin film onto top openings of the outer periphery wall section; and electrode posts formed so as to pass through the outer periphery wall section and the ceiling section, wherein;

said photosensitive resin film constituting said ceiling section comprises a photosensitive resin to which is added a mica filler.

12. A piezoelectric component according to claim 11, wherein said outer periphery wall section is formed by photolithography with a photosensitive resin having an elastic modulus of not more than 3 GPa, and said ceiling section is formed by a photosensitive resin film in which 10 to 45% by weight of a mica filler is added to a photosensitive resin.

13. A piezoelectric component according to claim 11, wherein said outer periphery wall section is formed by photolithography with a photosensitive resin having an elastic modulus of not more than 3 GPa, and said ceiling section is formed by a photosensitive resin film in which 10 to 45% by weight of a mica filler is added to a photosensitive resin, and which has an elastic modulus of 5 GPa or greater.

* * * * *